United States Patent [19]

Okada et al.

[11] Patent Number: 5,468,315
[45] Date of Patent: Nov. 21, 1995

[54] METHOD OF AND APPARATUS FOR PRODUCING MULTILAYER CERAMIC BOARD

[75] Inventors: Ken'ichi Okada, Yokohama; Masahiro Takagi, Hadano; Hiroshi Hasegawa, Kanagawa; Ryoji Iwamura, Yokohama, all of Japan

[73] Assignee: Hitachi, Ltd., Tokyo, Japan

[21] Appl. No.: 95,221

[22] Filed: Jul. 23, 1993

[30] Foreign Application Priority Data

Jul. 27, 1992 [JP] Japan ............... 4-199424

[51] Int. Cl.$^6$ ............... B32B 18/00
[52] U.S. Cl. ............... 156/64; 156/583.1; 156/89; 156/580; 156/381; 100/93 P; 100/220; 100/246; 100/38; 425/519; 425/520; 425/111; 425/408
[58] Field of Search ............... 100/93 P, 220, 100/231, 233, 246, 38, 436 RM; 156/583.1, 583.6, 583.7, 580, 89; 425/63, 89, 500, 502, 517, 519, 520, 521, 110, 111, 116, 125, 128, 329, 354, 355, 408, 410, 411, 436 R, 438, 441, 443, 444

[56] References Cited

U.S. PATENT DOCUMENTS

| | | | |
|---|---|---|---|
| 3,196,485 | 7/1965 | Battenfield et al. | 425/415 |
| 3,551,952 | 1/1971 | Mouse | 100/93 |
| 3,701,707 | 10/1972 | Scholl et al. | 156/212 |
| 3,709,457 | 1/1973 | Church | 425/125 |
| 3,743,463 | 7/1973 | Patrick et al. | 425/394 |
| 4,127,378 | 11/1978 | Meadors | 425/392 |
| 4,534,725 | 8/1985 | Hemmelgarn et al. | 172/328 |
| 4,610,618 | 9/1986 | Schmidts et al. | 425/394 |
| 4,675,066 | 6/1987 | Honda | 100/93 |
| 4,689,105 | 8/1987 | Fazlin et al. | 156/103 |
| 4,720,255 | 1/1988 | Mittelstadt | 425/394 |
| 4,743,328 | 5/1988 | Zwirner | 156/500 |
| 4,780,166 | 10/1988 | Hunter | 156/180 |
| 5,037,287 | 8/1991 | Hirai | 425/78 |
| 5,044,918 | 9/1991 | Brussel | 425/397 |
| 5,051,218 | 9/1991 | Matthews | 419/10 |
| 5,156,854 | 10/1992 | Yamada | 425/78 |
| 5,169,310 | 12/1992 | Chance et al. | 432/258 |
| 5,174,842 | 12/1992 | Hamuro et al. | 156/89 |
| 5,238,640 | 8/1993 | Masui et al. | 425/125 |

FOREIGN PATENT DOCUMENTS 1456810  4/1975  United Kingdom ............... 100/93 P

*Primary Examiner*—W. Gary Jones
*Assistant Examiner*—Mark De Simone
*Attorney, Agent, or Firm*—Antonelli, Terry, Stout & Kraus

[57] ABSTRACT

An apparatus for producing a multilayer ceramic board having uniform density over the total area of the green sheets after a thermal compression bonding comprises a lower mold in which a plurality of green sheets, having conductive wiring patterns printed thereon, are to be set in a stacked state, an upper mold which comes into contact with a top surface of the uppermost sheet of the plurality of green sheets and applies a pressing load on the stacked green sheets toward the lower mold, and a restraining mold which restraining the plurality of green sheets in the stacked state therein and having an inner wall surface in contact with peripheral wall portions of the upper and lower molds, the confining mold being movably supported in a direction of the pressing load of the upper mold.

16 Claims, 4 Drawing Sheets

METHOD OF AND APPARATUS FOR PRODUCING MULTILAYER CERAMIC BOARD

BACKGROUND OF THE INVENTION

The present invention relates to a method of and apparatus for producing a multilayer ceramic board, and more particularly, to a method of and an apparatus for producing a multilayer ceramic board formed by stacking and thermally compression bonding green sheets having conductive wiring patterns for interconnecting a plurality of electronic devices and elements.

FIG. 7 is a flow chart illustrating an overview of the manufacturing process of the multilayer ceramic board formed by stacking and thermally compression bonding green sheets having conductive wiring patterns. In the initial stage of producing the multilayer ceramic board, a green sheet is made, then cut into a required shape and throughholes are formed thereon. Subsequently, a conductive wiring pattern is printed on the green sheet and a pressing for flattening can be conducted thereon. Then, a plurality of the above-mentioned green sheets are stacked and thermally compression bonded. After thermally compression bonding, the peripheral area of the green sheets are trimmed to form a predetermined shape, the green sheets are sintered at a predetermined temperature, a plating is applied to portions of the conductive wiring patterns and connectors, and finally LSI devices are mounted thereon. 1 As disclosed, for example, in a Japanese Utility Model Unexamined Publication No. 63-170232, a conventional apparatus for producing the multilayer ceramic board is known, wherein green sheets are stacked in a stack mold, then the mold is fixed by bolts and the sheets in the stacked state are thermally compression bonded and sintered.

However, in the conventional apparatus, there has been an unfavorable phenomenon that pressure on the peripheral edge portion of the green sheets becomes weaker than on other portions due to friction between the peripheral edge portion of the green sheets and inner wall surface of the stack mold. Namely, uniform pressure cannot be applied over the entire area of the green sheets.

When the above-mentioned phenomenon occurs, density becomes non-uniform over the entire area of the green sheets.. More specifically, as shown in FIG. 8, the density in the peripheral edge portion 1a and in the opposite surface 1b to the pressure applied surface 1c of the green sheets 1 becomes coarse; and the density in the center portion of the pressure applied surface 1c becomes fine.

When the green sheets 1 having the above-mentioned non-uniform density-distribution are stacked, thermally, compression bonded and then sintered, a difference in the sintering shrinkage rate along the thickness of the green sheets 1 occurs. As a result, a "camber" of the green sheets 1 is generated as shown in FIG. 10, since a relationship between the density and sintering shrinkage rate of the green sheets has a property in which the finer the density becomes, the lesser the level of the sintering shrinkage rate becomes as shown in FIG. 9.

The "camber" of the green sheets lowers dimensional accuracy of the conductive pattern and yield ratio in manufacturing and further results a rise of the manufacturing cost.

SUMMARY OF THE INVENTION

An object of the present invention is to provide a method and apparatus for producing a multilayer ceramic board having uniform density over the entire area of the green sheets after being thermally compression bonded.

An apparatus of the present invention comprises a lower mold in which a plurality of green sheets having conductive wiring patterns printed thereon are to be set in a stacked state; an upper mold which comes into contact with a top surface of an uppermost sheet of the plurality of green sheets and applies a pressing load on the stacked green sheets toward the lower mold; a restraining mold to restrain the plurality of green sheets in the stacked state therein and having an inner wall surface in contact with peripheral wall portions of the upper and lower molds, with the restraining mold being movably supported in a direction of the pressing load of the upper mold; and heaters provided in the upper and lower molds.

According to the above-mentioned construction, the restraining mold can travel toward the lower mold together with the pressure loading travel of the upper mold. Consequently, no frictional force results between the peripheral edge portions of the green sheets and the inner wall surface of the restraining mold.

Accordingly, a density of a molded product of the green sheets becomes uniform over the total area thereof, and a density gradient along a thickness of the green sheets does not exist.

DESCRIPTION OF THE PREFERRED EMBODIMENTS

A detailed description of the preferred embodiments of the present invention will now be given in conjunction with the accompanying drawings.

Figure 1:
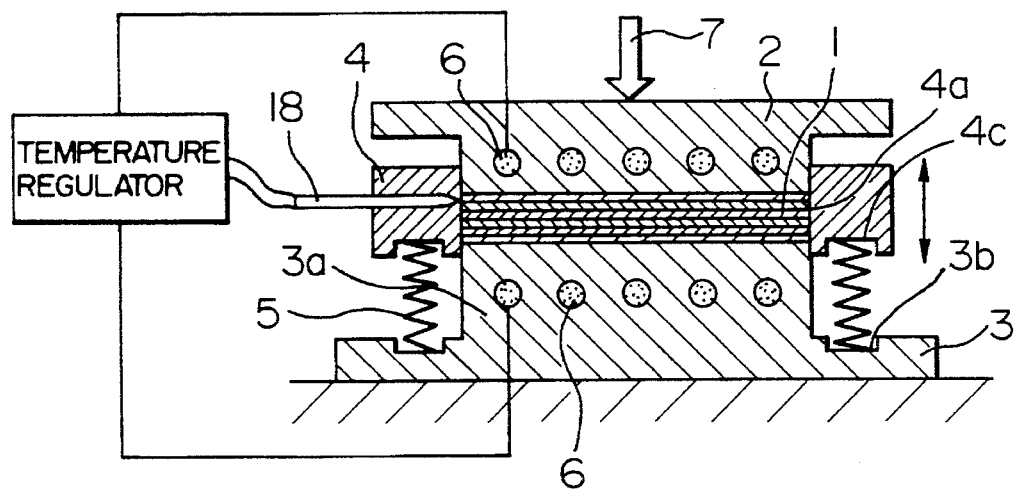
FIG. 1 is a sectional view of an embodiment of an apparatus for producing a multilayer ceramic board according to the present invention.

In FIG. 1, a green sheet, of a raw ceramic sheet before sintering produced by a doctor blade method has a conductive wiring pattern printed thereon by, for example, screen printing. An upper mold 2 presses the green sheets 1 and an lower mold 3 receives the green sheets 1 for setting thereon. A restraining mold of which an inner wall surface 4a comes into contact with peripheral wall portions of the upper mold 2 and lower mold 3 to restrain and locate the green sheets 1 in stacked condition within the inside of the inner wall surface 4a.

Figure 2:
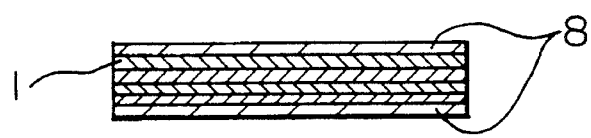
FIG. 2 is a sectional view of laminated green sheets clamped by separation sheets.
Figure 3:
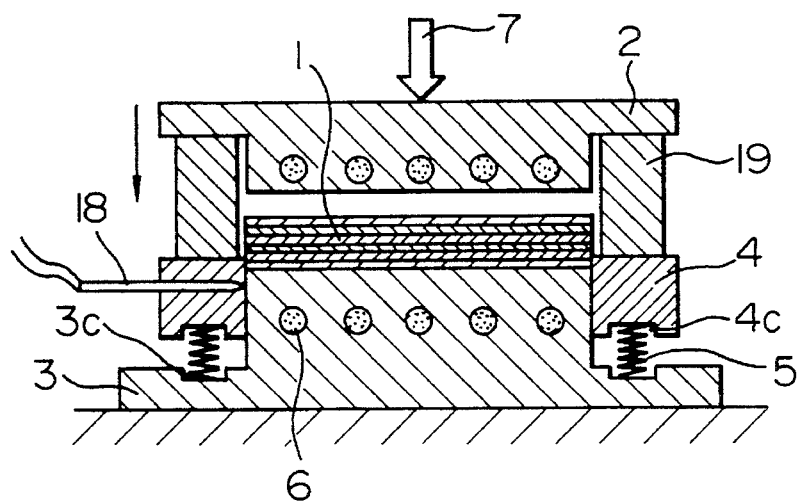
FIG. 3 is a sectional view showing a method of releasing the green sheets after thermal compression bonding from the molds.

The restraining mold 4 is biased toward the upper mold by springs 5 provided between a fixing portion 4c of the mold 4 and the opposite fixing portion 3b of the lower mold 3. The restraining mold 4 is movable up and down by sliding along a guide portion 3a of the lower mold 3 while the inner wall surface 4a is in contact with the peripheral wall portion of the upper mold 2. Heaters 6 are provided in the upper and lower molds 2, 3. In addition, the restraining mold 4 is provided with a thermocouple 18 which measures the temperature of the restraining mold 4 and a temperature regulator regulates the current output of the heaters 6 to control the temperature of the upper and lower molds 2, 3.

with the above-mentioned structure, as shown in FIG. 1, a plurality of green sheets 1 prior to sintering, are stacked and placed on the lower mold 3 in which green sheets are clamped by separation sheets 8 (FIG. 2). Locating of the stacked green sheets 1 is performed by the inner wall surface 4a of the restraining mold 4 because outer dimension of the green sheet 1 is slightly smaller than inner dimension of the restrain mold 4.

The heaters 6 then are heated up to a temperature at which the thermal compression bonding of the green sheets 1 is effected. When temperature of the green sheets 1 reaches a predetermined processing temperature, a compressive force 7 is exerted on the upper mold 2 to move the mold 2 downwardly. As a result, the plurality of green sheets 1 are thermally compression bonded.

Figure 4:
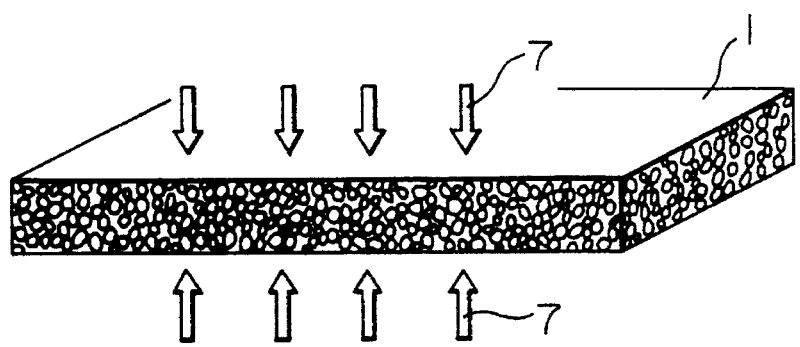
FIG. 4 is a perspective view of green sheets produced by the embodiment illustrated in FIG. 1.

To obtain uniform density of a molded product of the green sheets 1, the compressive-force is retained for a predetermined period. Then, the upper mold 2 is moved upwardly to unload. Subsequently, the heating operation by the heaters 6 is stopped, and a mold-releasing frame 19 as shown in FIG. 4 is placed on the restrain mold 4. Then, the upper mold 2 is moved downwardly to push the restraining mold 4 down, thus enabling the release of the green sheets 1 from the restraining mold 4. The molded product of the green sheets 1 is taken out to finish the thermally compression bonding process.

In the aforementioned thermally compression bonding process, the restraining mold 4 is moved toward the lower mold 3 together with the pressure loading travel of the upper mold 2 and a compression stroke of the green sheets 1. Therefore, no frictional force results between the peripheral edge portion of green sheets 1 and the inner wall surface of the restraining mold 4. Therefore, the problem of low pressure loading along the peripheral portion of the green sheets 1 can be avoided, and the uniform pressure loading upon the entire area of the green sheets 1 is achieved. Accordingly, as shown in FIG. 4, the density the molded product of the green sheets 1 becomes uniform over the entire area thereof and the density gradient along the thickness of green sheets 1 does not exist.

Figure 5:
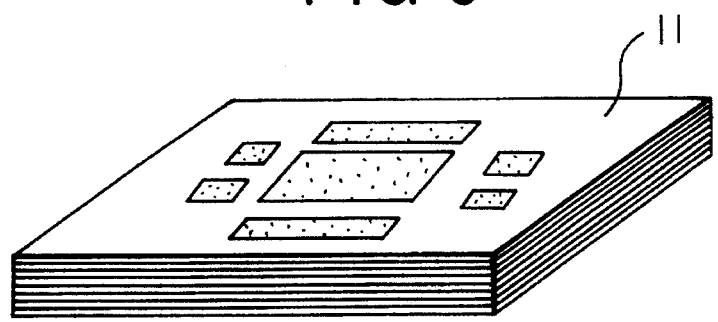
FIG. 5 is a perspective view of a ceramic board obtained in accordance with the embodiment illustrated in FIG. 1.

Thus, the ceramic board 11 after sintering becomes flat and there is no "camber" as shown in FIG. 5 and a good ceramic board having high accuracy in dimension can be obtained.

The following is a description of a concrete example of the above multilayer ceramic board 11. Thirty green sheets 1 having the outside dimension of 100 mm length×100 mm width×0.3 mm thickness on which conductive wiring patterns are screen-printed were stacked in the restraining mold 4 having the dimension of inner wall surface of 100.1 mm length×100.1 mm width. The green sheets 1 were subsequently heated at approximately 120° C. and compressed by applying pressure loading of compressive force 7 of approximately ten tons for ten minutes. Consequently, a molded-product with high quality having no crack in the end portion of the green sheets 1 and no density gradient along the thickness of the green sheets 1 could be obtained. Furthermore, when the molded product of the green sheets 1 is sintered at approximately 1,600° C., a multilayer ceramic board 11 having high accuracy can be obtained of which an extent of "camber" was 0.03 mm or less and dispersion of the sintering shrinkage rate was within±0.2%.

Figure 6:
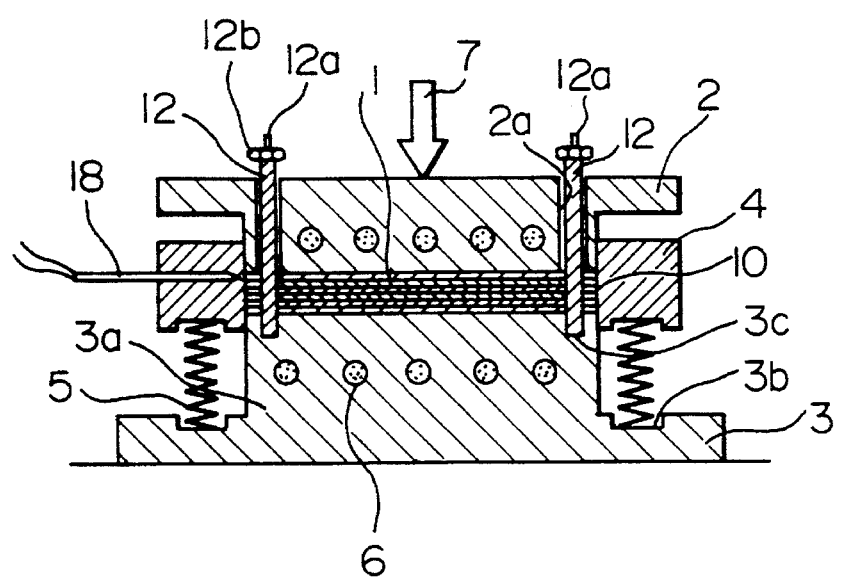
FIG. 6 is a sectional view of another embodiment of an apparatus for producing the multilayer ceramic board according to the present invention.
Figure 7:
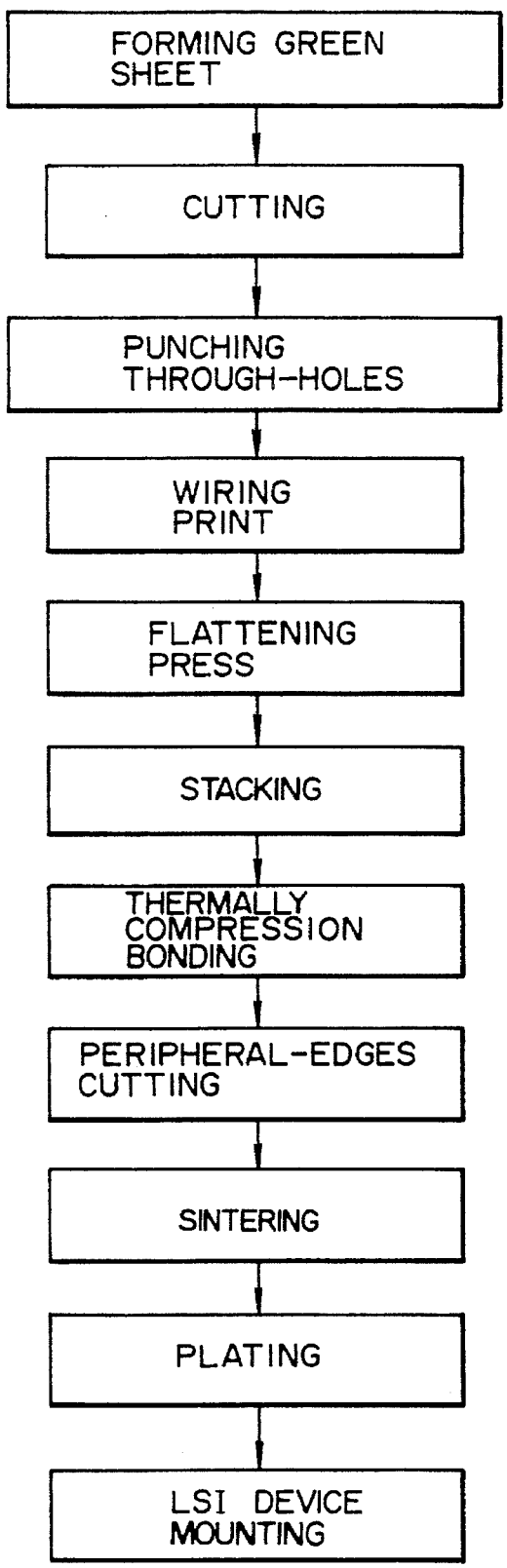
FIG. 7 is a flow chart showing the manufacturing process of the multilayer ceramic board.
Figure 8:
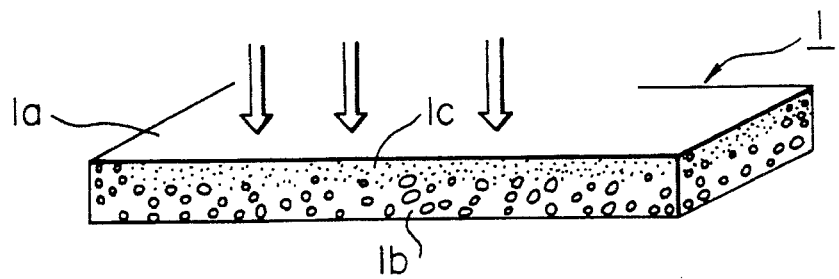
FIG. 8 is a perspective view of green sheets produced by a prior art apparatus.
Figure 9:
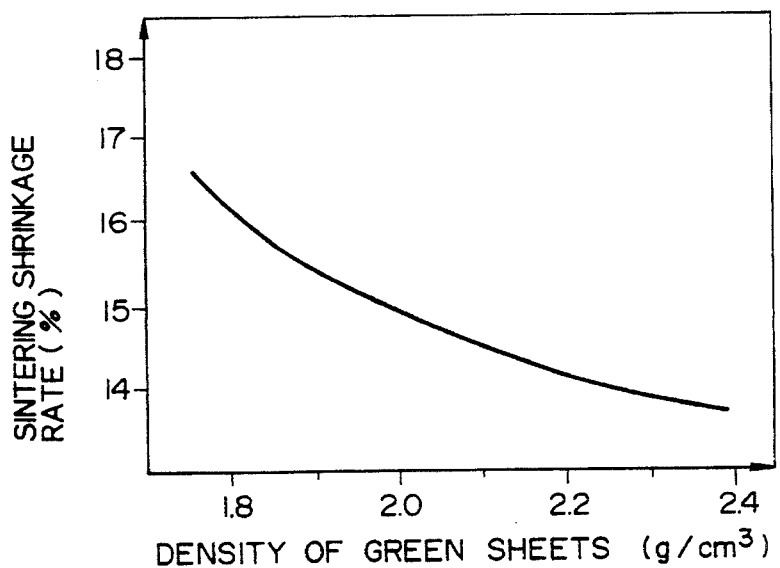
FIG. 9 is a graph showing a relationship between the density of the green sheets and the sintering shrinkage rate.
Figure 10:
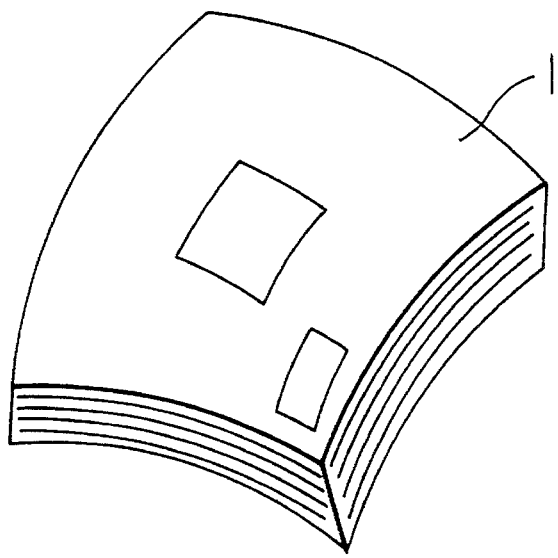
FIG. 10 is a perspective view of the ceramic board obtained by a prior art apparatus.

FIG. 6 shows another embodiment according to the present invention, wherein locating pins 12 are inserted in holes 3c provided in the lower mold 3 and run through locating holes 10 provided in the green sheets 1. Thus, a plurality of the green sheets 1 can be stacked with higher accuracy. The upper mold 2 is provided with pin through-holes 2a in such a manner that the locating pins 12 does not interfere with the down travel of the upper mold 2. In addition, one end porion of each locating pins 12 is provided with a threaded portion 12a. When the upper mold 2 travels downwardly and thermally compression bonding is completed, a nut 12b having a larger external diameter than the diameter of the pin through-hole 2a is secured on each locating pin. Subsequently, when the upper mold 2 travels up, the locating pins 12 travel up,thus enabling the locating pins 12 to be pulled off from the green sheets 1.

In the above-mentioned structure, a predetermined number of the green sheets 1 having locating holes 10 can be stacked accurately in the lower mold 3 by the pin through-holes 2a and the locating pins 12 while the upper mold 2 is lifted. Then, in the same manner as described in the first embodiment, temperature of heaters 6 are raised to the thermally compression bonding temperature. When the temperature of the green sheets 1 subsequently reaches a predetermined temperature for processing,compressive force 7 is applied to the upper mold 2 to travel it down to thermally compression bond the plurality of the green sheets 1.

After the completion of the thermally compression bonding, the heating conducted by heaters 6 is stopped, and the nut 12b is fastened to the threaded portion 12a of each locating pin 12. Subsequently, the upper mold 2 is lifted and the locating pins 12 are pulled out from the green sheets 1. Then, a molded product of the green sheets is released from the restrain mold 4 in the same manner as the first embodiment shown in FIG. 1. Consequently, the thermal compression bonding process is finished.

After the thermal compression bonding, the molded product is sintered. A multilayer ceramic board 11 of which dimensional accuracy of the conductive wiring patterns after sintering is further improved is obtained because locating accuracy of the green sheets upon stacking is fine. Of course, the board has less "camber" and strain, since the dispersion of the sintering shrinkage rate is small because of the uniform density of the molded product of the green sheets.

From the foregoing description with respect to the apparatus for manufacturing the multilayer ceramic board according to the present invention, the restraining mold 4 travels downwardly to the lower mold 3 in accordance with the travel of the upper mold 2. Therefore, no frictional force results between the peripheral edge portion of the green sheets 1 and the inner wall surface of the restraining mold 4.

Consequently, the density of the molded product of the green sheets over the entire area of the green sheets 1 becomes uniform and density gradient along the thickness of the green sheets 1 does not exist. Therefore, the multilayer ceramic board having the following advantageous effects can be produced: less or no "camber" and strain after the thermally compression bonding of the green sheets; excellent dimensional accuracy of the conductive wiring patterns; and good yield rate while manufacturing the same.

What is claimed is:

1. An apparatus for producing a multilayer ceramic board comprising:

a lower mold member adapted for stacking thereon a stack of green sheets having conductive wiring patterns printed on at least one sheet an upper mold member positioned above said lower mold member and adapted for downward movement into contact with a top surface of the uppermost sheet of the stack of green sheets to apply a pressing load on the stack of green sheets toward the lower mold member, a restraining mold member, support means resiliently supporting said restraining mold member with an inner wall surface of said restraining mold member in contact with peripheral wall portions of said upper and lower mold members to restrain flow of the green sheets in a direction perpendicular to a pressing direction of the pressing load on the stack of green sheets, while permitting downward movement of said restraining mold member with the stack of green sheets as the stack of green sheets is compressed in response to the downward movement of said upper mold member due to the pressing load, whereby said restraining mold member travels downwardly toward said lower mold member in accordance with the compression of the stack of green sheets, thereby minimizing generation of frictional force between the peripheral edges of the green sheets and said inner wall surface of the restraining mold member so as to minimize camber and to result in substantially uniform density in the resulting multilayer ceramic board.

2. An apparatus according to claim 1, further comprising heaters in said upper and lower mold members.

3. An apparatus according to claim 2, wherein said restraining mold member includes a thermocouple to measure the temperature of the green sheets in the stack.

4. An apparatus according to claim 3, further comprising a temperature regulator which regulates a current output to said heaters based upon the temperature measured by said thermocouple.

5. An apparatus according to claim 1, further comprising locating pins standing upright from said lower mold member for aligning the green sheets in the stack.

6. An apparatus according to claim 5, wherein said lower and upper mold members have bore holes for insertion of said locating pins.

7. An apparatus according to claim 6, wherein each of said locating pins includes a threaded end portion projecting upwardly from said upper mold member, and wherein a nut having a larger external diameter than the bore holes is secured on each of said threaded end portions of said locating pins.

8. An apparatus for producing a multilayer ceramic board comprising:

a lower mold member adapted for stacking thereon a stack of green sheets, having conductive wiring patterns printed on at least one sheet, an upper mold member positioned above said lower mold member and adapted for downward movement into contact with a top surface of the uppermost sheet of the stack of green sheets to apply a pressing load on the stack of green sheets toward the lower mold member, restraining means, support means resiliently supporting said restraining means with an inner wall surface of restraining means in contact with peripheral wall portions of said upper and lower mold members to restrain flow of the green sheets in a direction perpendicular to a pressing direction of the pressing load in the stack of green sheets, while permitting downward movement of said restraining means with the stack of green sheets as the stack of green sheets is compressed in response to downward movement of said upper mold member due to the pressing load, whereby said restraining means travels downwardly toward said lower mold member in accordance with the compression of the stack of green sheets, thereby minimizing generation of frictional force between the peripheral edge portions of the green sheets and said inner wall surface of said restraining means so as to minimize camber and to result in substantially uniform density in the resulting multilayer ceramic board; and heating means provided in said upper and lower mold members for heating the stack of green sheets.

9. An apparatus according to claim 8, wherein said restraining means includes measuring means for measuring the temperature of the green sheets in the stack.

10. An apparatus according to claim 9, further comprising temperature regulating means for regulating a current output to said heating means based upon the temperature measured by said measuring means.

11. An apparatus according to claim 8, further comprising means standing upright from said lower mold member for locating the green sheets in the the stack.

12. A method of producing a multilayer ceramic board by an apparatus including a lower mold member in which a plurality of green sheets, having conductive wiring patterns printed on at least one sheet are set in a stack, and an upper mold member positioned above said lower mold member for downward movement into contact with a top surface of the uppermost sheet of the stack of green sheets to apply a pressing load downwardly on the stack of green sheets toward the lower mold member, said method comprising the steps of:

restraining flow of the green sheets in a direction perpendicular to a pressing direction of the pressing load on the green sheets with restraining means having an inner wall surface in contact with peripheral wall portions of said upper and lower mold members and being resiliently supported for movement in the direction of the pressing load on the stack of green sheets;

raising a temperature of heating means provided in said upper and lower mold members to heat the stack of green sheets to a predetermined temperature; and thermally compression bonding the green sheets by moving said upper mold member downwardly toward said lower mold member with said restraining means moving downwardly toward the lower mold member as the stack of green sheets is compressed in response to the pressing load, whereby said restraining means travels downwardly toward said lower mold member in accordance with the compression of the stack of green sheets, thereby minimizing generation of frictional force between the peripheral edge portions of the green sheets and said inner wall surface of the restraining means so as to minimize camber and to result in substantially uniform density in the resulting multilayer ceramic board.

13. A method according to claim 12, further comprising the step of measuring the temperature of the green sheets in the stack with temperature measuring means of said restraining means.

14. A method according to claim 12, further comprising the step of regulating a current output to said heating means based upon the temperature measured by said measuring means.

15. A method according to claim 12, further comprising the stacking green sheets on locating pins, which stand upright from said lower mold member, through locating holes provided in the green sheets and through holes in said upper mold member.

16. A method according to claim 15, wherein each of said locating pins includes a threaded and portion projecting upwardly from through holes of said upper mold member, and after the completion of the thermal compression bonding of the green sheets, secunng a nut, having a larger external diameter than each through hole in said upper mold member, on each of said threaded end portions of said locating pins, and pulling out said locating pins from the compressed green sheets simultaneously with lifting of said a upper mold member.

* * * * *